United States Patent
Hu

(10) Patent No.: US 12,232,401 B2
(45) Date of Patent: Feb. 18, 2025

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xiaojing Hu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/759,855

(22) PCT Filed: Jul. 11, 2022

(86) PCT No.: PCT/CN2022/104969
§ 371 (c)(1),
(2) Date: Jul. 30, 2022

(87) PCT Pub. No.: WO2024/000639
PCT Pub. Date: Jan. 4, 2024

(65) Prior Publication Data
US 2024/0188385 A1 Jun. 6, 2024

(30) Foreign Application Priority Data
Jun. 29, 2022 (CN) .......................... 202210755500.0

(51) Int. Cl.
*B32B 3/10* (2006.01)
*H10K 59/80* (2023.01)
(Continued)

(52) U.S. Cl.
CPC ........... *H10K 59/873* (2023.02); *H10K 59/40* (2023.02); *H10K 2102/311* (2023.02); *H10K 2102/351* (2023.02)

(58) Field of Classification Search
CPC ..... H10K 59/10; H10K 59/40; B32B 2457/20
See application file for complete search history.

(56) References Cited

U.S. PATENT DOCUMENTS

2021/0120691 A1 4/2021 Su et al.

FOREIGN PATENT DOCUMENTS

| CN | 208271483 U | 12/2018 |
| CN | 208622357 U | 3/2019 |

(Continued)

OTHER PUBLICATIONS

International Search Report in International application No. PCT/CN2022/104969, mailed on Dec. 26, 2022.
(Continued)

*Primary Examiner* — Elizabeth E Mulvaney
(74) *Attorney, Agent, or Firm* — PV IP PC; Wei Te Chung

(57) ABSTRACT

Embodiments of the present invention provide a display module and a display device. The display module includes a substrate, a light-emitting layer, and a cover plate, and the cover plate includes a hard layer and a protective layer. A surface hardness of the hard layer is greater than a surface hardness of the protective layer, and a thickness of the protective layer is less than or equal to 50 um. When a stylus is used to touch the flexible panel, the hard layer can prevent scratches from forming on a surface of the hard layer, and meanwhile, the display module has better bending performance, thereby improving the overall performance of the flexible display device.

20 Claims, 5 Drawing Sheets

(51) Int. Cl.
*H10K 59/40* (2023.01)
*H10K 102/00* (2023.01)

(56) References Cited

FOREIGN PATENT DOCUMENTS

| | | |
|---|---|---|
| CN | 209199986 U | 8/2019 |
| CN | 209461079 U | 10/2019 |
| CN | 110571251 A | 12/2019 |
| CN | 110634406 A | 12/2019 |
| CN | 111063258 A | 4/2020 |
| CN | 111599268 A | 8/2020 |
| CN | 111613140 A | 9/2020 |
| CN | 112185247 A * | 1/2021 |
| CN | 113050829 A | 6/2021 |
| CN | 113366556 A | 9/2021 |
| CN | 113709274 A | 11/2021 |
| CN | 113763808 A | 12/2021 |
| CN | 113990205 A | 1/2022 |
| CN | 114360386 A | 4/2022 |
| CN | 216183379 U | 4/2022 |
| CN | 114550588 A | 5/2022 |
| CN | 114582239 A | 6/2022 |
| CN | 216817722 U | 6/2022 |
| KR | 20200052016 A | 5/2020 |
| WO | 2021003740 A1 | 1/2021 |

OTHER PUBLICATIONS

Written Opinion of the International Search Authority in International application No. PCT/CN2022/104969, mailed on Dec. 26, 2022.
Chinese Office Action issued in corresponding Chinese Patent Application No. 202210755500.0 dated Dec. 30, 2022, pp. 1-10.

* cited by examiner

DISPLAY MODULE AND DISPLAY DEVICE

BACKGROUND OF INVENTION

Field of Invention

The present invention relates to a field of technical of manufacturing display panels, and in particular, to a display module and a display device.

Description of Prior Art

With development of display technologies such as display panel manufacturing processes, people have put forward higher requirements for performance and quality of display panels and display devices.

Development of flexible materials is becoming more and more mature, mobile phone equipment with flexible and foldable organic light-emitting diode (OLED) devices has set off a wave of high-end mobile phones in recent years. More and more mobile phone manufacturers are investing in development of flexible and foldable mobile phones. As for a flexible display panel, since the flexible panel has good bending performance, it can be bent or folded to a certain extent according to different working conditions, so it is widely used in various fields. As for a flexible display panel, due to its bendable and foldable characteristics, layers in the display panel are required to have better bending properties. However, although the display panel prepared in the prior art can guarantee its bending and folding properties to a certain extent, it cannot guarantee the hardness and strength of corresponding layers. In addition, the existing flexible display panel is usually equipped with a stylus to improve operation performance. When a user touches or slides on the flexible display panel with the stylus, since the hardness and strength of the flexible layers are not ideal, scratches are easy to leave on the touch layer. In severe cases, the layers may even be cracked, thereby reducing the reliability and quality of the flexible device, which is not conducive to further improving the overall performance of the flexible display panel.

Therefore, there is a need to propose solutions to the problems in the prior art.

To sum up, in the flexible display panels and display devices provided in the prior art, when touch and other operations are performed on surfaces of the flexible display panels and devices, a plurality of scratches are easy to form on the surfaces of the layers, thereby reducing use experience, which is not conducive to improvement of overall performance of the flexible display device.

SUMMARY OF INVENTION

In order to solve the above problems, embodiments of the present invention provide a display module and a display device, so as to effectively improve a bending performance of the flexible display device and a problem that scratches are easily formed on surfaces of layers during touch operations and other operations, and to improve quality and overall performance of the flexible display device.

In order to solve the above-mentioned technical problems, the present invention provides a display module, including:
a substrate;
a light-emitting layer disposed on a side of the substrate; and
a cover plate disposed on a side of the light-emitting layer away from the substrate, wherein the cover plate includes: a protective layer and a hard layer sequentially disposed on the side of the light-emitting layer away from the substrate, a surface hardness of the hard layer is greater than a surface hardness of the protective layer, and a thickness of the protective layer is less than or equal to 50 um;
wherein the hard layer includes a plurality of filled regions and a non-filled region disposed at a side of the filled regions; and
wherein a reinforcement layer is disposed in each of the filled regions, and a surface hardness of the reinforcement layer is 0.6 H-1.2 H greater than a surface hardness of the hard layer in the non-filled region.

According to an embodiment of the present invention, a ratio of a thickness of the hard layer to the thickness of the protective layer ranges from 0.05 to 0.15.

According to an embodiment of the present invention, the surface hardness of the hard layer is in a range of 5 H-9 H, and the surface hardness of the protective layer is in a range of 3 H-5 H.

According to an embodiment of the present invention, the hard layer includes an organic-inorganic hybrid composite, and the protective layer includes ultra-thin glass.

According to an embodiment of the present invention, the display module further includes a buffer layer, and the buffer layer is disposed between the light-emitting layer and the cover plate.

According to a second aspect of embodiments of the present invention, a display module is provided, and a display module including:
a substrate;
a light-emitting layer disposed on a side of the substrate; and
a cover plate disposed on a side of the light-emitting layer away from the substrate, wherein the cover plate includes: a protective layer and a hard layer sequentially disposed on the side of the light-emitting layer away from the substrate, a surface hardness of the hard layer is greater than a surface hardness of the protective layer, and a thickness of the protective layer is less than or equal to 50 um.

According to an embodiment of the present invention, a ratio of a thickness of the hard layer to the thickness of the protective layer ranges from 0.05 to 0.15.

According to an embodiment of the present invention, the surface hardness of the hard layer is in a range of 5 H-9 H, and the surface hardness of the protective layer is in a range of 3 H-5 H.

According to an embodiment of the present invention, the hard layer includes an organic-inorganic hybrid composite material, and the protective layer includes ultra-thin glass.

According to an embodiment of the present invention, the display module further includes a buffer layer, and the buffer layer is disposed between the light-emitting layer and the cover plate.

According to an embodiment of the present invention, an elastic modulus of the buffer layer ranges from 1 Mpa to 1 Gpa, and a percentage of breaking elongation of the buffer layer is greater than or equal to 200%.

According to an embodiment of the present invention, an interior of the buffer layer includes a honeycomb structure.

According to an embodiment of the present invention, a ratio between a thickness of the buffer layer and a thickness of the cover plate is in the range of 1-3.

According to an embodiment of the present invention, a distance between the buffer layer and the cover plate is less than 150 um.

According to an embodiment of the present invention, the hard layer includes a plurality of filled regions and a non-filled region disposed at a side of the filled regions; and wherein a reinforcement layer is disposed in each of the filled regions, and a surface hardness of the reinforcement layer is greater than a surface hardness of the hard layer in the non-filled region.

According to an embodiment of the present invention, the filled regions are defined on the hard layer at intervals, and a distribution density of the filled regions corresponding to an edge region of the hard layer is greater than a distribution density of the filled regions corresponding to a central area of the hard layer.

According to an embodiment of the present invention, the hard layer includes a first hard layer, a flexible layer, and a second hard layer, the first hard layer is disposed on the protective layer, the flexible layer is disposed on the first hard layer, and the second hard layer is disposed on the flexible layer; and wherein a surface hardness of the first hard layer is greater than a surface hardness of the second hard layer.

According to an embodiment of the present invention, the second hard layer is configured as a grid-shaped hollow structure.

According to an embodiment of the present invention, a surface of a side of the second hard layer close to the first hard layer is provided with micro-protrusions.

According to a third aspect of embodiments of the present invention, a display device is further provided, and the display device includes the display module provided in the embodiments of the present application.

To sum up, beneficial effects of the embodiments of the present invention are as followed:

Embodiments of the present invention provide a display module and a display device, wherein the display module includes a substrate, a light-emitting layer, and a cover plate, wherein the cover plate includes a protective layer and a hard layer sequentially disposed on the side of the light-emitting layer away from the substrate, a surface hardness of the hard layer is greater than a surface hardness of the protective layer, and a thickness of the protective layer is less than or equal to 50 um. When the flexible panel is touched by a stylus or the like, since the hard layer has a certain hardness and strength, a problem of scratches formed by the stylus on a surface of a flexible layer is alleviated. Meanwhile, a buffer layer is also arranged in the display module, and the buffer layer can further protect the display module during bending and touch processes, thereby improving a overall performance such as quality of the flexible display device.

DETAILED DESCRIPTION OF PREFERRED EMBODIMENTS

The following descriptions of the various embodiments refer to the accompanying drawings to illustrate specific embodiments in which the present disclosure may be practiced.

With continuous development of technology of manufacturing display panel, especially for development of technology of manufacturing flexible folding display device, people have put forward higher requirements on performance and display effect of flexible bendable, and foldable display devices.

Figure 1:
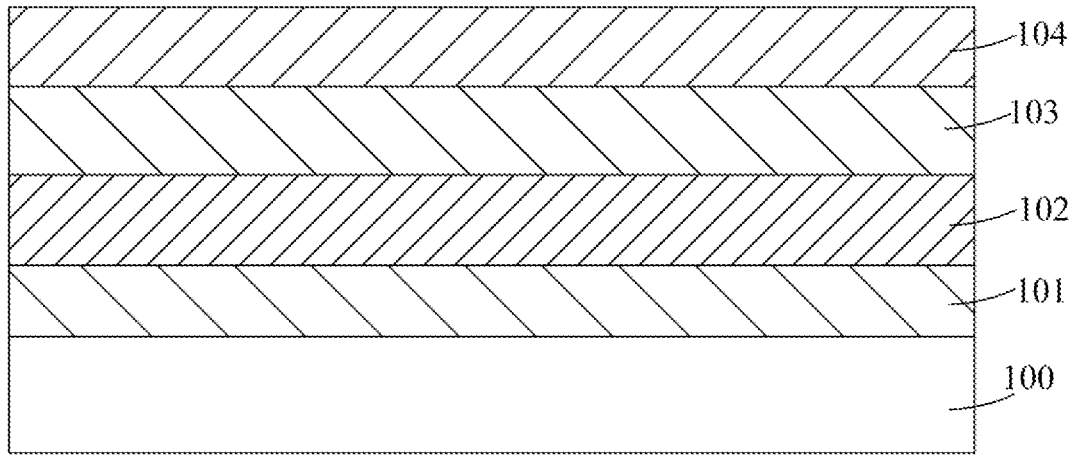
FIG. 1 is a schematic structural diagram of each layer of a flexible display device provided in the prior art.

As shown in FIG. 1, FIG. 1 is a schematic structural diagram of each layer of a flexible display device provided in the prior art. The display device includes a display module 100, an optical adhesive layer 101, a first cover plate 102, an optical adhesive layer 103, and a second cover plate 104. The optical adhesive layer 101 and the optical adhesive layer 103 mainly play a sticking function, and the first cover plate 102 and the second cover plate 104 are mainly used for supporting and protecting. Since the flexible display panel can be bent or folded, each layer is thin and the bending performance is good.

In order not to reduce the bending performance of the flexible display device, in the prior art, the bending performance is generally improved by reducing hardness of the first cover plate 102 and the second cover plate 104. However, when the hardness of the first cover plate 102 and the second cover plate 104 is reduced, if an object such as a stylus is used to touch or slide on a surface of the object, more scratches will be left on the surface, thereby reducing the quality and overall performance of the flexible display device.

Embodiments of the present application provide a display module and a display device, so as to effectively improve the bending performance of a flexible display panel and alleviating the problem that scratches are easily formed on surfaces of layers of the flexible display panel, so as to improve the quality and overall performance of the display device.

Figure 2:
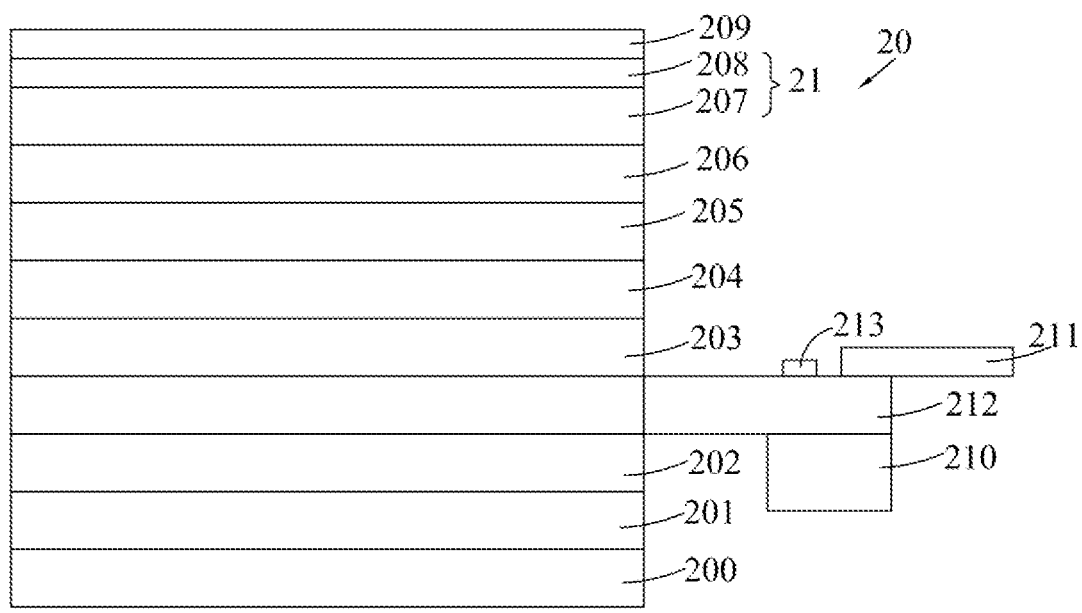
FIG. 2 is a schematic structural diagram of layers of a flexible display device provided by an embodiment of the present application.

As shown in FIG. 2, FIG. 2 is a schematic structural diagram of layers of a flexible display device provided by an embodiment of the present application. The display device provided in an embodiment of the present application is described by taking a flexible display device as an example. The flexible display device is provided with a display module. Specifically, the display module includes a stack structure of multiple layers. For example, the display module includes a display panel 20 and a cover plate 21. The cover plate 21 is disposed on the display panel 20 to protect the display panel 20. In an embodiment of the present application, the display panel 20 is a flexible bendable or foldable panel, and thus achieves the bending performance of the display device.

Specifically, in an embodiment of the present application, the flexible display panel 20 is provided as a multi-film structure. The display panel 20 is provided with a first optical adhesive layer 206, a buffer layer 205, a second optical adhesive layer 204, a polarizer 203, a light-emitting layer 212, a first support backplane 202, a second buffer layer 201 and a metal support layer 200.

The second buffer layer 201 is disposed on the metal support layer 200, the second buffer layer 201 is directly attached to the metal support layer 200, and the first support backplane 202 is disposed on the second buffer layer 201. In an embodiment of the present application, each of the first support backplane 202 and the metal support layer 200 can play a certain role of fixing and supporting.

Meanwhile, the first support backplane 202 and the metal support layer 200 can be made of the same material. Preferably, the metal support layer 200 can be made of metal materials with better heat dissipation performance, such as metal steel, aluminum, and so on. When the display panel works normally, the metal support layer 200 can absorb excess heat generated inside the display panel and dissipate the excess heat to an outside of the display module, thereby ensuring stability of the internal temperature of the display device. Preferably, the metal support layer 200 may be made of a material such as a steel sheet.

Further, the light-emitting layer 212 is disposed on the first support backplane 202, and the light-emitting layer 212 is supported and fixed by the first support backplane 202. Meanwhile, a polarizer 203 is also arranged on the light-emitting layer 212. In addition, a second optical adhesive layer 204 is arranged on the polarizer 203, and a buffer layer 205 is arranged on the second optical adhesive layer 204. The polarizer 203 and the buffer layer 205 are bonded and fixed to each other by the second optical adhesive layer 204.

Preferably, the first optical adhesive layer 206 is disposed on the buffer layer 205, and the cover plate 21 is disposed on the first optical adhesive layer 206, and the cover plate 21 and the buffer layer 205 in the display panel are connected to each other by the first optical adhesive layer 206 to form the display module provided in an embodiment of the present application.

The first optical adhesive layer 206 and the second optical adhesive layer 204 can be set in the same layer and made of material. For example, the first optical adhesive layer 206 and the second optical adhesive layer 204 are both set to have the same thickness, and both of the first optical adhesive layer 206 and the second optical adhesive layer 204 are made of pressure-sensitive adhesive with high light transmittance or other adhesive materials with better adhesion.

Further, in an embodiment of the present application, the flexible display panel is provided with the cover plate 21. Specifically, the cover plate 21 not only has good bending and folding performance, but also has high strength and hardness, so that when a stylus is used to perform touch operations on the cover plate 21, no traces such as scratches will be left on the cover plate 21, thereby effectively improving the overall performance of the flexible display device.

Figure 3:
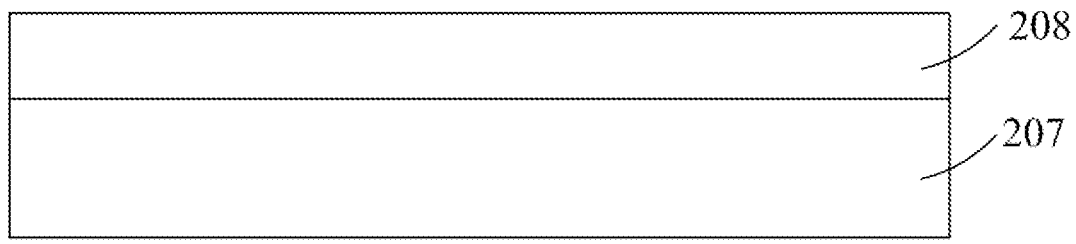
FIG. 3 is a schematic structural diagram of a cover plate provided in an embodiment of the application.

Specifically, as shown in FIG. 3, FIG. 3 is a schematic structural diagram of a cover plate 21 provided in an embodiment of the application. Combined with the device structure in FIG. 2, the cover plate 21 includes a hard layer 208 and a protective layer 207 arranged in sequence. The hard layer 208 is disposed on the protective layer 207, and the hard layer 208 is disposed on a side of the protective layer away from the light-emitting layer 212.

In an embodiment of the present application, the hard layer 208 and the protective layer 207 are combined to form the cover plate 21. The surface hardness of the hard layer 208 is greater than the surface hardness of the protective layer 207. Since the surface hardness of the hard layer 208 is relatively high, when a stylus is used to touch and slide on the hard layer 208, the stylus will not leave traces on the hard layer 208.

Meanwhile, in an embodiment of the present application, the thickness of the protective layer 207 is less than or equal to 50 um. Preferably, the thickness of the protective layer 207 is set to range from 30 um and 50 um, such as set at 50 um. As such, it is ensured that the ultra-thin panel can be realized while having a good supporting effect.

Preferably, in an embodiment of the present application, the surface hardness of the hard layer 208 is set to be between 5 H and 9 H. Specifically, the surface hardness can be set according to a touch area of the actual product and the product model. Meanwhile, when disposing the hard layer 208, the hard layer 208 can be directly coated on the protective layer 207 by a wet coating process, and then dried to form a final hard layer. Alternatively, the formed hard layer 208 is directly attached to the protective layer 207 to improve the surface strength of the flexible display device provided in an embodiment of the present application.

Further, in an embodiment of the present application, the material of the hard layer 208 is a composite material having protective hybrid or hybridized organic and inorganic phases. For example, the material of the hard layer 208 is selected as an inorganic-organic material containing silicon. Specifically, the material of the hard layer 208 is any one of a siloxane and acrylic polymer, a sesquisiloxane polymer, and inorganic silicon-containing aliphatic or aromatic polymers.

When the material of the hard layer 208 is selected from siloxane and acrylic polymer materials, the surface hardness of the hard layer 208 can reach more than 7 H. When using a stylus to touch, since the hardness at a tip of the stylus is generally between 3 H-4 H, no scratches are left on the surface of the hard layer 208 when the stylus is slid on the surface of the hard layer 208.

Further, the hard layer 208 in an embodiment of the present application also has better recovery performance. For example, when the stylus or other relatively hard object is slid on the surface of the hard layer 208, it will leave traces on the surface to a lesser extent when applied with a larger force. However, the hard layer 208 has a self-healing function, and when the stylus or other force-applying object leaves, the formed traces can be automatically repaired and healed. Therefore, when the user observes, the surface of the hard layer 208 is still a flat surface. Therefore, the hard layer 208 in an embodiment of the present application effectively improves the performance of the surfaces of the layers of the device, and improves its overall performance.

Among them, in an embodiment of the present application, since the hard layer 208 is made of a hybrid material of inorganic-organic phases, more siloxane organic materials can be arranged on the surface of the hard layer 208. The siloxane organic polymer material has good elastic recovery properties, so that micro-scratches formed on its surface can be healed and disappear automatically. Specifically, the traces on the surface of the hard layer 208 can be slowly healed within 3 s to 15 s during automatic repair and healing.

In order to ensure the effect of the hard layer 208, in an embodiment of the present application, the thickness of the hard layer 208 is set to range from 3 um to 40 um, and meanwhile, the surface of the hard layer 208 has good oil stain resistance.

Figure 4:
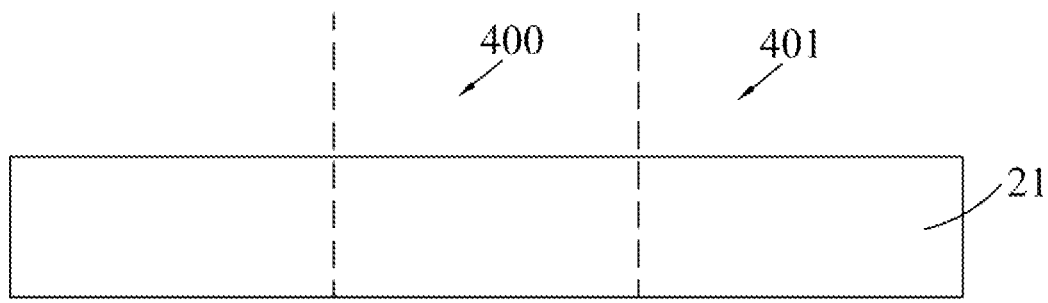
FIG. 4 is a schematic plan view of the cover plate provided in an embodiment of the application.

Preferably, as shown in FIG. 4, FIG. 4 is a schematic plan view of the cover plate provided in an embodiment of the application. The cover plate 21 of the display module includes a bending area 400 and a flat area 401, wherein the flat area 401 is defined at at least one side of the bending area 400.

When the display module is bent, the cover plate 21 will be bent accordingly. Therefore, when the hard layer in the cover plate 21 is arranged in an embodiment of the present application, the thickness of the hard layer can be set according to effects of bending forces in different regions. Preferably, in an embodiment of the present application, the thickness of the hard layer is uniform in different regions of the protective layer, so as to ensure the performance of the hard layer.

Meanwhile, the flexible display device in an embodiment of the present application can achieve a small or ultra-small bending radius, and specifically, the bending radius can be lower than 1.5 mm. Since the bending radius is small, the bending stress received is the largest in the bending region 400. Therefore, in an embodiment of the present application, the thickness of the layer at the central area of the bending area 400 may be smaller than the thickness of the hard layer at the edge area of the bending area 400, so as to ensure a reinforcement effect of the hard layer while the flexible display device still has good bending performance.

Further, when the flexible panel is bent, it has irregular bending. Therefore, in an embodiment of the present application, when the hard layer is disposed in the cover plate 21, the thickness of the hard layer may gradually decrease from the flat area 401 to the bending area 400. Preferably, the thickness of the hard layer decreases linearly. A specific magnitude of reduction can be set according to the bending radius of the actual product. Therefore, the layers in different regions have better bending effect and performance.

Figure 8:
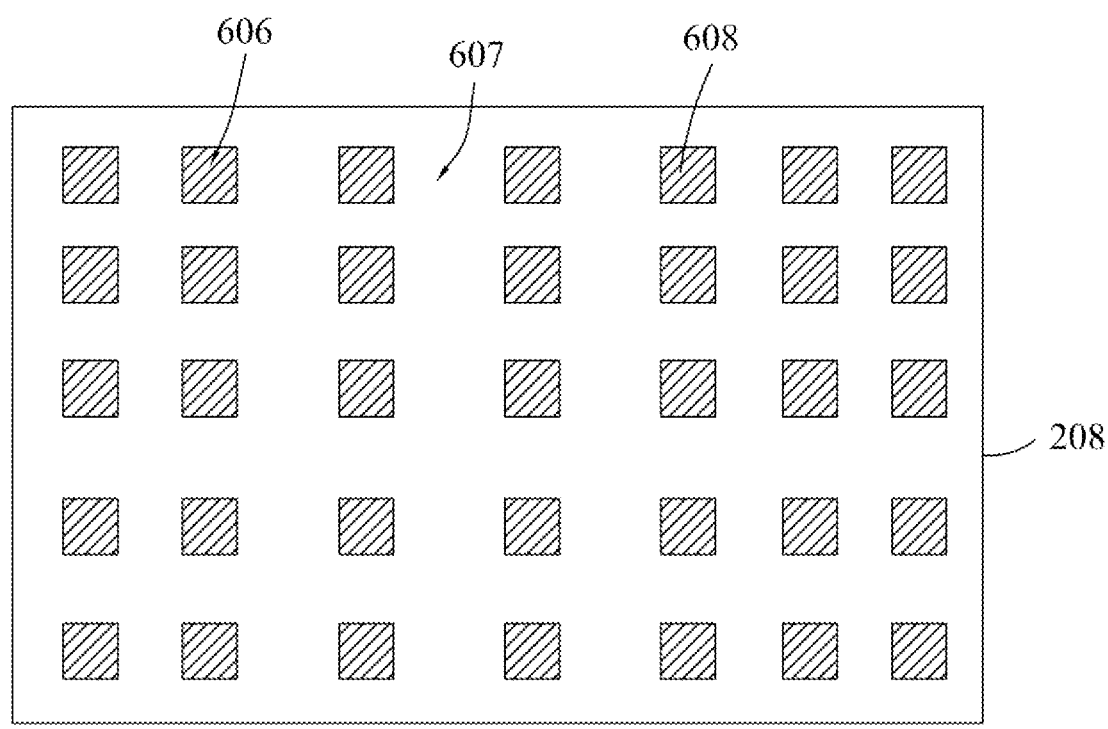
FIG. 8 is a schematic structural diagram of the hard layer provided by an embodiment of the present application.
Figure 9:
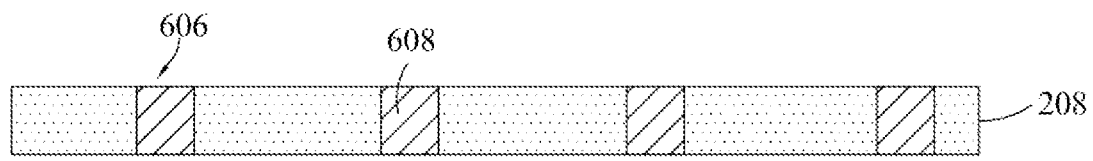
FIG. 9 is a schematic cross-sectional view of the hard layer provided in an embodiment of the application.

Further, as shown in FIG. 8, FIG. 8 is a schematic structural diagram of the hard layer provided by an embodiment of the present application. And as shown in FIG. 9, FIG. 9 is a schematic cross-sectional view of the hard layer provided in an embodiment of the application. The hard layer 208 in an embodiment of the present application includes a plurality of filled regions 606 and a non-filled region 607. Through holes are provided at the positions of the filled regions 606. In an embodiment of the present application, the filled region 606 having a shape the same as a structure of the through hole is taken as an example for description. Meanwhile, a reinforcement layer 608 is provided in the filled region 606.

Specifically, the reinforcement layer 608 fills each filled region, and when the filled region 606 is arranged, a structure of each filled region 606 can be set to the same to ensure a consistency of the preparation process. Meanwhile, the plurality of filled regions 606 may be distributed on the hard layer 208 in an array. Preferably, the filled regions 606 are arranged in an array on rows and columns corresponding to the hard layer 208, and the filled regions 606 are arranged on the hard layer at intervals.

In an embodiment of the present application, when the reinforcement layer 608 is disposed in each of the filled regions 606, the surface hardness of the reinforcement layer 608 is greater than the surface hardness of the corresponding hard layer in the non-filled region 607. When a stylus is used to touch the surface of the hard layer, and the hard layer is bent, the reinforcement layer with higher hardness can prevent the stylus from forming scratches on the surface of the hard layer. Meanwhile, the hard layer 208 in the non-filled region can ensure a better flexibility, thereby improving the overall performance of the panel.

Specifically, the hardness of the reinforcement layer 608 may be 0.6 H-1.2 H higher than the hardness of the hard layer in the non-filled region 607. Preferably, the surface hardness of the reinforcement layer 608 is 1 H higher than the surface hardness of the hard layer.

Preferably, when the above-mentioned reinforcement layer is provided, the distribution density of the reinforcement layer corresponding to the edge region of the hard layer may be greater than the distribution density of the reinforcement layer corresponding to the center region of the hard layer. Thus, the bending effect of the hard layer is guaranteed.

Figure 10:
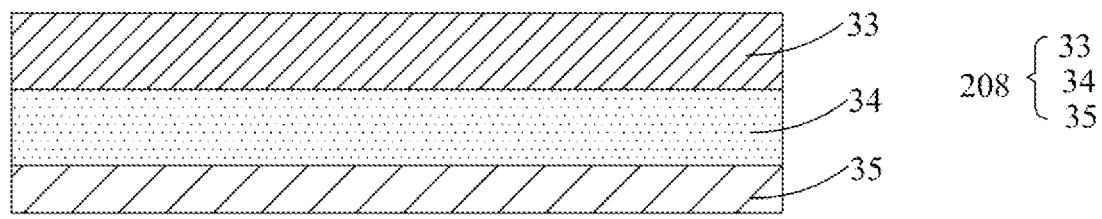
FIG. 10 is another schematic structural diagram of the hard layer provided by an embodiment of the application.

Specifically, as shown in FIG. 10, FIG. 10 is another schematic structural diagram of the hard layer provided by an embodiment of the application. In an embodiment of the present application, the hard layer 208 further includes a multi-layered film structure. Specifically, the hard layer 208 includes a first hard layer 33, a flexible layer 34, and a second hard layer 35.

The second hard layer 35 is arranged on the protective layer 207, the flexible layer 34 is arranged on the second hard layer 35, and the first hard layer 33 is arranged on the flexible layer 34. In an embodiment of the present application, in order to improve the bending effect of the layer, the material hardness corresponding to the flexible layer is smaller than the material hardness of the first hard layer 33 and the second hard layer 35.

Preferably, in an embodiment of the present application, the surface hardness of the first hard layer 33 may be greater than the surface hardness of the second hard layer 35. Specifically, the surface hardness of the first hard layer 33 is 0.3 H greater than the surface hardness of the second hard layer. Therefore, without reducing the high hardness of the hard layer, the hard layer also has a certain elastic recovery performance, thereby improving the performance of the display panel.

Meanwhile, in an embodiment of the present application, the second hard layer 35 may also be configured as a grid-like structure, such as a hollow grid structure. The hollow grid can be set as a polygonal grid, a circular grid, a long grid, and so on, and the specific structure can be set according to the requirements of the actual product. By setting the second hard layer as a hollow structure, the bending performance of the hard layer is improved. Moreover, in an embodiment of the present application, since the grid structure further increases the bending performance of the hard layer, when the hard layer is bent, the bending becomes easier.

Further, flexible glue can also be filled in the hollow grid to ensure that the hard layer has better overall performance. In an embodiment of the present application, the thickness of the first hard layer 33 is greater than the thickness of the second hard layer 35. Meanwhile, the thickness of the flexible layer 34 can be set according to the actual product requirements and overall thickness, which is not specifically limited herein.

Figure 11:
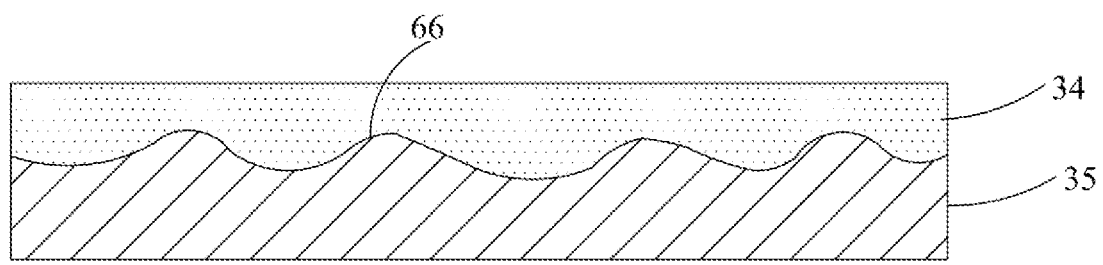
FIG. 11 is still another schematic structural diagram of the hard layer provided in an embodiment of the present application.

Further, as shown in FIG. 11, FIG. 11 is still another schematic structural diagram of the hard layer provided in an embodiment of the present application. In an embodiment of the present application, when the flexible layer 34 and the second hard layer 35 are provided, a surface of a side of the second hard layer 35 close to the first hard layer 33 is further provided with a micro-protrusion structure 66. The micro-protrusions 66 can be configured as wave-shaped protrusions or other shapes.

In an embodiment of the present application, there is a buffer recess between adjacent ones of the micro-protrusions 66. When the stylus touches the first hard layer, if the touch force of the stylus is greater, when a larger touch force scratches into the corresponding buffer recess, part of the force will be buffered and reduced, thereby reducing the force on the hard layer, thereby achieving the purpose of reducing scratches. Specifically, the structure of the micro-protrusions can be set according to the size of the actual product.

Preferably, in an embodiment of the present application, the hard layer 208 is configured as a transparent hard layer. In addition, the light transmittance of the hard layer 208 is ensured to be greater than 90%, thereby reducing the shielding of light by the hard layer, and effectively improving the display effect of the flexible display device.

Further, the cover plate 21 in an embodiment of the present application is further provided with a protective layer 207. The protective layer 207 is adhered to the flexible display panel. In an embodiment of the present application, the surface hardness of the protective layer 207 is smaller than the surface hardness of the hard layer. Preferably, the surface hardness of the protective layer 207 can be set to 3 H-5 H, and meanwhile, the ratio between the thickness of the hard layer and the thickness of the protective layer is between 0.05-0.15. Since the thickness of the protective layer 207 is relatively small, the hard layer can well strengthen a strength of the surface of the hard layer. Preferably, the thickness of the hard layer is set to 6 um, and the corresponding thickness of the protective layer is set to 50 um. In this case, a ratio between the thickness of the hard layer and the thickness of the protective layer is 0.12. Therefore, by controlling the parameters between different layers in the cover plate, the overall performance of the panel can be further improved. Alternatively, the parameters of the above-mentioned layers may be limited according to the actual product, which will not be repeated herein for brevity.

In an embodiment of the present application, the protective layer 207 mainly plays a supporting role. When the stylus touches the display panel, the problem of collapse will not occur, thereby improving the performance of the display panel.

Specifically, the protective layer 207 may be selected from ultra thin glass (UTG) or other organic layers with certain hardness and supporting effect. In an embodiment of the present application, the protective layer 207 may be an outer cover plate of the flexible display device. By arranging an ultra-thin glass cover plate at the outermost layer of the flexible display device, without increasing the thickness of the device, the reliability and quality of the device can be guaranteed.

Preferably, the thickness of the protective layer is set to be less than or equal to 50 um. Preferably, the thickness of the protective layer 207 is set to range from 30 um and 50 um, such as set at 50 um. As such, it is ensured that the ultra-thin panel can be realized while having a good supporting effect. The protective layer 207 within the above thickness range will not affect the bending performance of the flexible display device, and meanwhile, the ultra-thin display device can be effectively realized, thereby achieving the purpose of improving the overall performance of the flexible display device.

Further, in an embodiment of the present application, a buffer layer 205 is further provided in the flexible display panel. The buffer layer 205 is disposed between the flexible display panel and the cover plate. Specifically, the buffer layer 205 can be disposed in the layers of the flexible display panel 20.

In an embodiment of the present application, the buffer layer 205 is disposed between the first optical adhesive layer 206 and the second optical adhesive layer 204. In addition, the film material of the buffer layer 205 is set to be a porous material, and for example, the buffer layer 205 is set to have a dense honeycomb structure layer.

Figure 5:
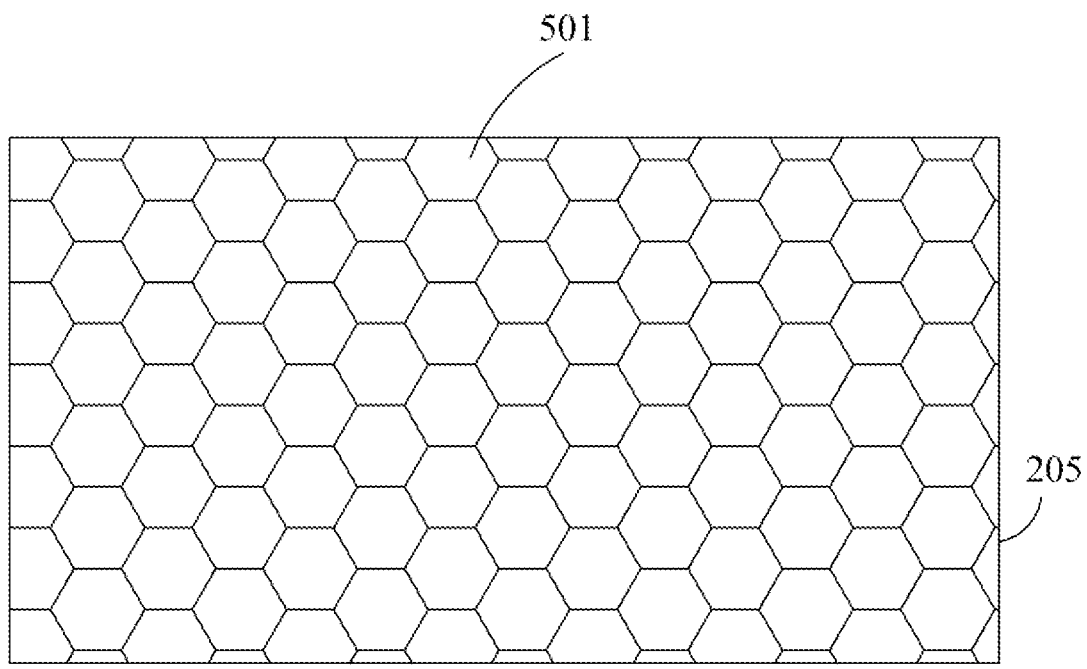
FIG. 5 is a schematic structural diagram of an interior of the buffer layer provided in an embodiment of the application.

As shown in FIG. 5, FIG. 5 is a schematic structural diagram of an interior of the buffer layer provided in an embodiment of the application. An interior of the buffer layer 205 includes a plurality of honeycomb holes 501. A cross-section of each of the plurality of honeycomb holes 501 in FIG. 5 is arranged in a hexagonal structure. The cross-sectional shape of the honeycomb hole 501 can also be set to other structures, which will not be described in detail herein for brevity.

In an embodiment of the present application, the honeycomb holes 501 may be set as any one of open-cell honeycomb holes and closed-cell honeycomb holes. When it is set as open-cell honeycomb holes, the adjacent open-cell honeycomb holes can be connected to each other to form the above-mentioned dense grid structure, and the open-cell honeycomb holes can form a certain gas circulation channel, thereby increasing the density performance inside the layer.

When an interior of the buffer layer is a closed-cell honeycomb, at this time, adjacent ones of the closed-cell honeycombs are isolated and not connected to each other. That is, there is no interconnection area between adjacent honeycomb holes. Preferably, in an embodiment of the present application, the honeycomb structure in the buffer layer can be set to any one of open-cell, closed-cell, and mixed structures according to actual needs. Therefore, the specific honeycomb holes can be set according to the actual product, which is not specifically limited herein.

Further, in an embodiment of the present application, the densities of the honeycomb holes in different regions of the buffer layer can be set to be the same. When the honeycomb holes 501 are provided, the sizes and shapes of the honeycomb holes 501 in the buffer layer can be set to be the same or different. When the sizes and shapes of the honeycomb holes 501 are set to the same structure, the buffer layer has better symmetry, thereby improving a buffering effect of the buffer layer.

Preferably, in an embodiment of the present application, when the buffer layer 205 and the cover plate 21 are provided, a ratio between the thickness of the buffer layer 205 to the thickness of the cover plate may be between 1 and 3, and preferably, the ratio of the thickness of the buffer layer 205 to the thickness of the cover plate 21 is 2, or the ratio of the thickness of the buffer layer 205 to the thickness of the cover plate 21 is set according to the bending radius of the actual product. Meanwhile, in order to further improve the effect of the buffer layer 205, in an embodiment of the present application, the distance between the buffer layer 205 and the cover plate is less than 150 um. Preferably, the distance between the buffer layer and the cover plate is set to be 50 um to ensure its buffering effect.

Specifically, in an embodiment of the present application, the material of the buffer layer 205 may be selected from thermoplastic polyurethane elastomer material or thermoplastic polyurethane elastomer rubber. During preparation, a foaming agent can be added to the above-mentioned materials through a foaming process to prepare the thermoplastic polyurethane elastomer rubber material in an embodiment of the present application, and the thermoplastic polyurethane elastomer rubber material is arranged in the display module.

In an embodiment of the present application, the buffer layer 205 has great elastic properties. The elastic modulus of the buffer layer 205 is preferably 1 Mpa-1 Gpa, and a percentage of breaking elongation of the buffer layer 205 is greater than or equal to 200%. In an embodiment of the present application, when the stylus touches the flexible display device with a large touch force, each layer will be recessed. For example, the ultra-thin glass layer will be recessed. Since the hardness of the ultra-thin glass layer is relatively high, if the touch force cannot be buffered, the ultra-thin glass layer will break, and even impact the polarizer 203 in the lower layer, thereby reducing the reliability and quality of the display device.

Therefore, in an embodiment of the present application, by arranging the buffer layer 205, the stress between the layers can be effectively buffered, so as to protect the ultra-thin glass layer and the polarizer 203.

Further, as shown in Table 1 below, Table 1 shows experimental performance data of display devices corresponding to different layers provided in embodiments of the present application.

TABLE 1 experimental performance data of display device

| | Stylus drop/cm | Ball drop/cm | Scratch/strip | Hardness/H | Bending force/N |
|---|---|---|---|---|---|
| Scheme 1 | 2-3 | <2 | 4-6 | 3-4 | 15 |
| Scheme 2 | 9-10 | 4-5 | 1 | 5-9 | <10 |

Scheme 1 and Scheme 2 are comparative experimental groups. In the above experimental groups, Scheme 1 adopts the flexible display device prepared in the prior art, and Scheme 2 adopts the flexible display device prepared in the embodiments of the present application. The difference between Scheme 1 and Scheme 2 is that the cover plate in Scheme 1 uses a conventional cover plate layer, while the cover plate in Scheme 2 uses the cover plate provided in the embodiments of the present application, such as ultra-thin glass. Meanwhile, the thermoplastic polyurethane elastomer rubber buffer layer in the embodiments of the present application is not provided in the Scheme 1, and other layers and structures are the same.

From the experimental data in the above table, it can be seen that the data obtained by the pen-drop and ball-drop experiments of the flexible display device obtained in the prior art are smaller than the pen-drop and ball-drop experiment data obtained by the flexible display device provided in the embodiments of the present application. In addition, when using the same force to slide on the surfaces of the devices with the stylus, 4-6 scratches will appear on the surface layer in Scheme 1, while in Scheme 2, only 1 scratch will occur, and a depth of the scratch is less than that in Scheme 1.

In addition, when the flexible devices in Scheme 1 and Scheme 2 are both bent to the same radius, for example, when the bending radius of the flexible devices is 1.5 mm, bending of the flexible device in Scheme 2 can be achieved by a bending force less than 10N, while bending of the flexible device in the comparative experimental group requires a larger bending force. Therefore, the flexible display device provided in the embodiments of the present application is superior to the flexible device in the prior art in both scratch resistance and bending performance.

Figure 6:
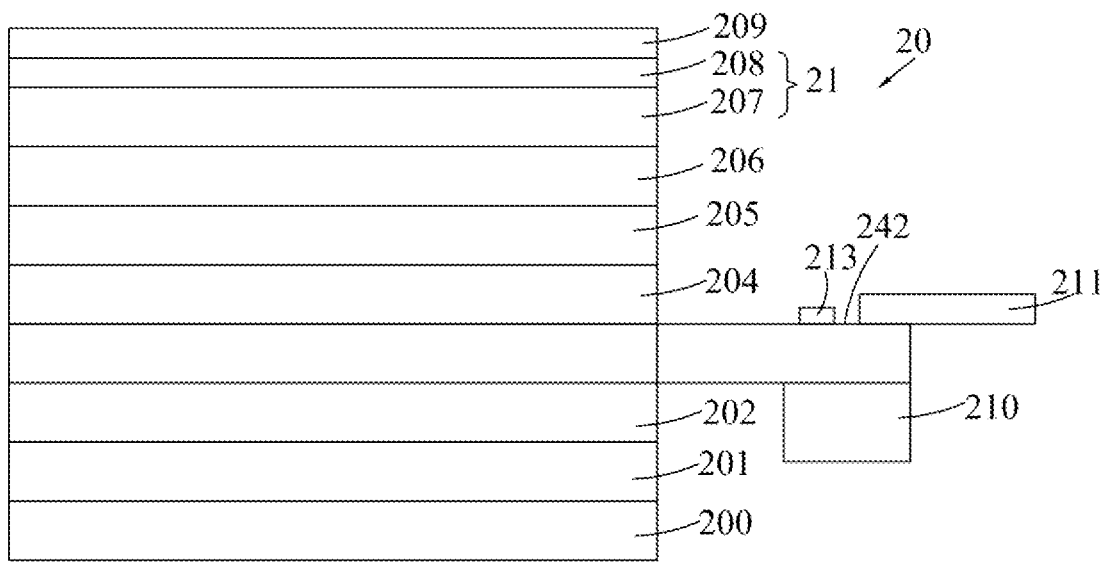
FIG. 6 is a schematic structural diagram of layers of another flexible display device provided by an embodiment of the present application.

Further, as shown in FIG. 6, FIG. 6 is a schematic structural diagram of layers of another flexible display device provided by an embodiment of the present application. Combining with the layer structure in FIG. 2, in an embodiment of the present application, a depolarizer process is used for preparation. In this embodiment of the present application, the polarizer layer is omitted in the display module, and meanwhile, the layer structure of the light-emitting layer 242 arranged in the flexible display device is different from that of the light-emitting layer arranged in FIG. 2, and the remaining layer structures may be arranged with reference to the structure in FIG. 2, and finally the flexible display device in an embodiment of the present application is formed.

In an embodiment of the present application, omitting the polarizer 203 can further reduce the thickness of the device, thereby effectively improving the bending performance of the device.

Further, the flexible display device further includes a second protective layer 209, and the second protective layer 209 is disposed on the outermost side of the flexible display device, that is, the second protective layer 209 is a surface layer of the display device. A user can then tear off or attach the second protective layer 209 according to personal preference.

In an embodiment of the present application, the second protective layer 209 is mainly a flexible layer material, such as polyethylene terephthalate, polyimide, or other polymer flexible layers.

Further, the flexible display device provided in the embodiments of the present application further includes a flexible circuit board 211 and an integrated circuit 213. The flexible circuit board 211 and the integrated circuit 213 are both arranged on one side of the display module, and for example, are arranged on one side of the light-emitting layer 212, and are attached to an extending part of the light-emitting layer 212, so as to provide a control signal to the light-emitting layer through the flexible circuit board 211. Further, the flexible display device further includes a second backplane 210. The second backplane 210 is disposed on one side of the light-emitting layer 212, and the second backplane 210 and the flexible circuit board 211 are disposed on opposite sides of the light-emitting layer 212, respectively, so that the second backplane 210 can better support the light-emitting layer 21 to further improve the reliability and overall performance of the flexible display device.

Preferably, in an embodiment of the present application, the first support backplane 202 can be made of a lightweight material, such as a carbon fiber material that is easy to bend. Preferably, the first support backplane 202 is made of polyacrylonitrile-based carbon fiber, polyurethane resin carbon-based fiber, polyimide, and the like. In addition, a thickness of the first support backplane 202 is set to be less than 90 um, so as to achieve thin, lightweight setting of the display device while ensuring the performance of the display device.

Preferably, the first support backplane 202 can also be configured as a hollow structure. For example, the first support backplane 202 is configured as a plurality of hollow strip structures in the bending area thereof. A plurality of hollow strips are alternately arranged on the first support backplane 202 in sequence. In an embodiment of the present application, by arranging a plurality of hollow strips on the first support backplane 202, when bending, the hollow strips can effectively reduce a bending stress of the backplane, thereby improving the bending performance of the flexible display device. Meanwhile, the hollow strip can further reduce the weight of the backplane, thereby realizing a thin, lightweight design of the flexible display device.

Figure 7:
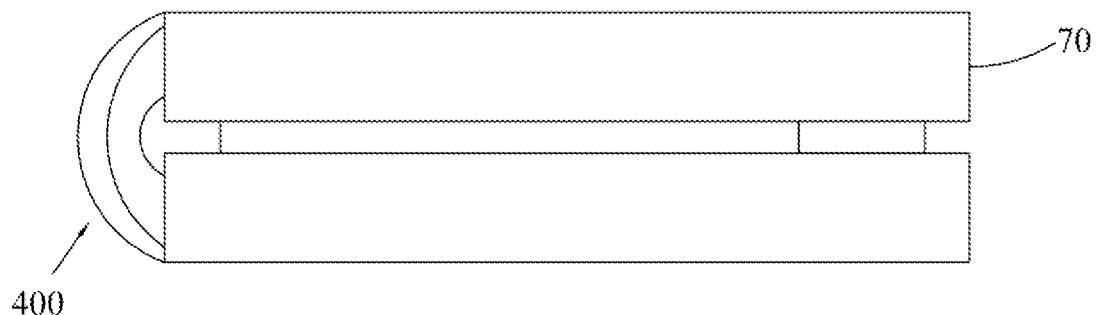
FIG. 7 is a schematic structural diagram of the flexible display device provided in an embodiment of the present application after the flexible display device is folded.

Preferably, as shown in FIG. 7, FIG. 7 is a schematic structural diagram of the flexible display device provided in an embodiment of the present application after the flexible display device is folded. After the flexible display device 70 is folded, a volume and unfolded area of the flexible display device 70 are reduced to half of the original, and the flexible display device 70 in the bending area 400 has a smaller bending radius. In an embodiment of the present application, the bending radius is less than 1.5 mm, thereby realizing an ultra-small bending radius. Meanwhile, when the flexible display device is unfolded and the stylus is used to slide on the surface, scratches will not be formed on the surface, thereby effectively improving the quality and overall performance of the flexible display device.

Further, in the embodiment of the present invention, the display module and the display device can be applied to any products or components with flexible bending or folding functions, such as mobile phones, computers, notebook computers, digital photo frames, etc., and the specific types thereof are not specifically limited.

To sum up, a display module and a display device provided by the embodiments of the present invention have been introduced in detail above. Specific examples are used in this paper to illustrate the principles and implementations of the present invention. The descriptions of the above embodiments are only used to help understand the technical solution of the present invention and its core idea. While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display module comprising:
   a substrate;
   a light-emitting layer disposed on a side of the substrate; and
   a cover plate disposed on a side of the light-emitting layer away from the substrate, wherein the cover plate comprises: a protective layer and a hard layer sequentially disposed on the side of the light-emitting layer away from the substrate, a surface hardness of the hard layer is greater than a surface hardness of the protective layer, and a thickness of the protective layer is less than or equal to 50 um;
   wherein the hard layer comprises a plurality of filled regions and a non-filled region disposed at a side of the filled regions; and
   wherein a reinforcement layer is disposed in each of the filled regions, and a surface hardness of the reinforcement layer is greater than a surface hardness of the hard layer in the non-filled region.

2. The display module according to claim 1, wherein a ratio of a thickness of the hard layer to the thickness of the protective layer ranges from 0.05 to 0.15.

3. The display module according to claim 2, wherein the surface hardness of the hard layer is in a range of 5 H-9 H, and the surface hardness of the protective layer is in a range of 3 H-5 H.

4. The display module according to claim 3, wherein the hard layer comprises an organic-inorganic hybrid composite, and the protective layer comprises ultra-thin glass.

5. The display module according to claim 1, wherein the display module further comprises a buffer layer, and the buffer layer is disposed between the light-emitting layer and the cover plate.

6. A display module comprising:
   a substrate;
   a light-emitting layer disposed on a side of the substrate;
   a cover plate disposed on a side of the light-emitting layer away from the substrate, wherein the cover plate comprises: a protective layer and a hard layer sequentially disposed on the side of the light-emitting layer away from the substrate, a surface hardness of the hard layer is greater than a surface hardness of the protective layer, and a thickness of the protective layer is less than or equal to 50 um; and
   a buffer layer disposed between the light-emitting layer and the cover plate, wherein an interior of the buffer layer comprises a honeycomb structure.

7. The display module according to claim 6, wherein a ratio of a thickness of the hard layer to the thickness of the protective layer ranges from 0.05 to 0.15.

8. The display module according to claim 7, wherein the surface hardness of the hard layer is in a range of 5 H-9 H, and the surface hardness of the protective layer is in a range of 3 H-5 H.

9. The display module according to claim 8, wherein the hard layer comprises an organic-inorganic hybrid composite material, and the protective layer comprises ultra-thin glass.

10. The display module according to claim 6, wherein an elastic modulus of the buffer layer ranges from 1 Mpa to 1 Gpa, and a percentage of breaking elongation of the buffer layer is greater than or equal to 200%.

11. The display module according to claim 6, wherein a ratio between a thickness of the buffer layer and a thickness of the cover plate is in the range of 1-3.

12. The display module according to claim 6, wherein a distance between the buffer layer and the cover plate is less than 150 um.

13. The display module according to claim 6, wherein the hard layer comprises a plurality of filled regions and a non-filled region disposed at a side of the filled regions; and
   wherein a reinforcement layer is disposed in each of the filled regions, and a surface hardness of the reinforcement layer is greater than a surface hardness of the hard layer in the non-filled region.

14. The display module according to claim 13, wherein the filled regions are defined on the hard layer at intervals, and a distribution density of the filled regions corresponding to an edge region of the hard layer is greater than a distribution density of the filled regions corresponding to a central area of the hard layer.

15. The display module according to claim 6, wherein the hard layer comprises a first hard layer, a flexible layer, and a second hard layer, the first hard layer is disposed on the protective layer, the flexible layer is disposed on the first hard layer, and the second hard layer is disposed on the flexible layer; and
   wherein a surface hardness of the first hard layer is greater than a surface hardness of the second hard layer.

16. The display module according to claim 15, wherein the second hard layer is configured as a grid-shaped hollow structure.

17. The display module according to claim 15, wherein a surface of a side of the second hard layer close to the first hard layer is provided with micro-protrusions.

18. A display device comprising the display module as claimed in claim 6.

19. The display module according to claim 1, wherein a surface hardness of the reinforcement layer is 0.6 H-1.2 H greater than a surface hardness of the hard layer in the non-filled region.

20. A display module comprising:
   a substrate;
   a light-emitting layer disposed on a side of the substrate; and
   a cover plate disposed on a side of the light-emitting layer away from the substrate, wherein the cover plate comprises: a protective layer and a hard layer sequentially disposed on the side of the light-emitting layer away from the substrate, a surface hardness of the hard layer is greater than a surface hardness of the protective layer, and a thickness of the protective layer is less than or equal to 50 um;
   wherein the hard layer comprises a first hard layer, a flexible layer, and a second hard layer, the first hard layer is disposed on the protective layer, the flexible layer is disposed on the first hard layer, and the second hard layer is disposed on the flexible layer; and
   wherein a surface hardness of the first hard layer is greater than a surface hardness of the second hard layer.

\* \* \* \* \*